United States Patent
Ovtchinnikov et al.

(10) Patent No.: US 7,764,723 B2
(45) Date of Patent: Jul. 27, 2010

(54) HIGH BRIGHTNESS LASER MODULE

(75) Inventors: Alex Ovtchinnikov, Worcester, MA (US); Igor Berishev, Holden, MA (US); Nikolai Strougov, Dudley, MA (US); Vadim Chuyanov, Oxford, MA (US)

(73) Assignee: IPG Photonics Corporation, Oxford, MA (US)

( * ) Notice: Subject to any disclaimer, the term of this patent is extended or adjusted under 35 U.S.C. 154(b) by 267 days.

(21) Appl. No.: 12/215,327

(22) Filed: Jun. 26, 2008

(65) Prior Publication Data

US 2009/0323736 A1      Dec. 31, 2009

(51) Int. Cl.
*H01S 5/00* (2006.01)
(52) U.S. Cl. .................... 372/50.12; 372/6
(58) Field of Classification Search ............ 372/35, 372/6, 99, 36, 50.12, 50.23
See application file for complete search history.

(56) References Cited

U.S. PATENT DOCUMENTS

| | | | |
|---|---|---|---|
| 4,879,722 A | 11/1989 | Dixon et al. | |
| 5,048,030 A | 9/1991 | Hiiro | |
| 5,212,707 A | 5/1993 | Heidel et al. | |
| 5,418,880 A | 5/1995 | Lewis et al. | |
| 6,229,831 B1 * | 5/2001 | Nightingale et al. | 372/36 |
| 7,058,101 B2 * | 6/2006 | Treusch et al. | 372/35 |
| 7,436,868 B2 * | 10/2008 | Schulte et al. | 372/36 |

* cited by examiner

*Primary Examiner*—Minsun Harvey
*Assistant Examiner*—Tuan N. Nguyen

(57) ABSTRACT

A powerful high-brightness laser pump modules is configured with a plurality of spaced laser diodes each generating a light beam at a pump wavelength, and respective groups of optical components guiding the light beams along parallel light paths. The groups of the optical components each include a lens assembly and a bending mirror configured to couple the beam light into an output fiber which is common to all groups of the optical component. At least one optical component of each group is provided with a dielectric layer capable of preventing propagation of a backreflected light toward laser diodes at a wavelength different from the pump wavelength.

4 Claims, 2 Drawing Sheets

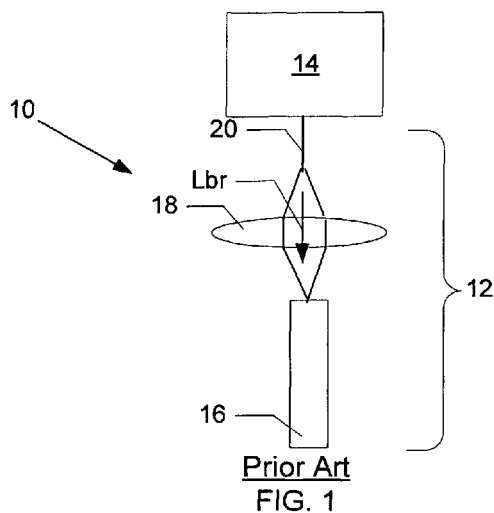
Prior Art
FIG. 1
FIG. 2
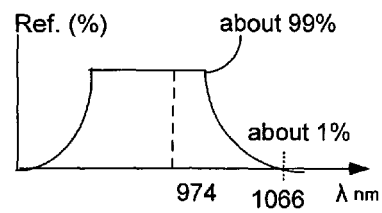
FIG. 3A
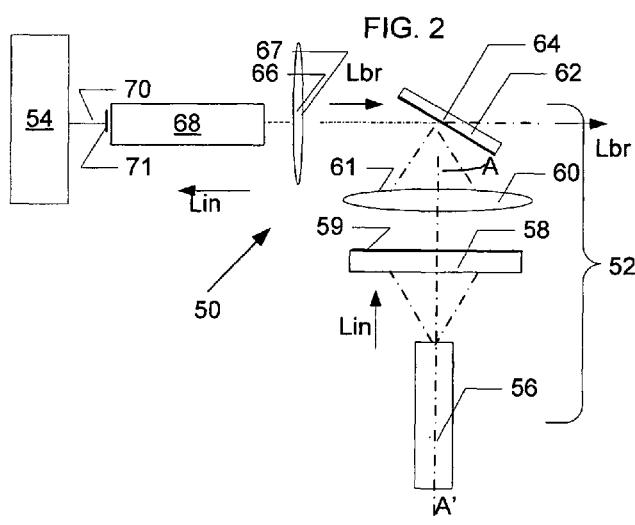
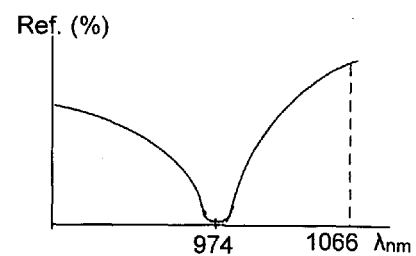
FIG. 3B
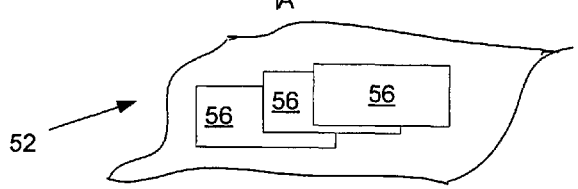
FIG. 4

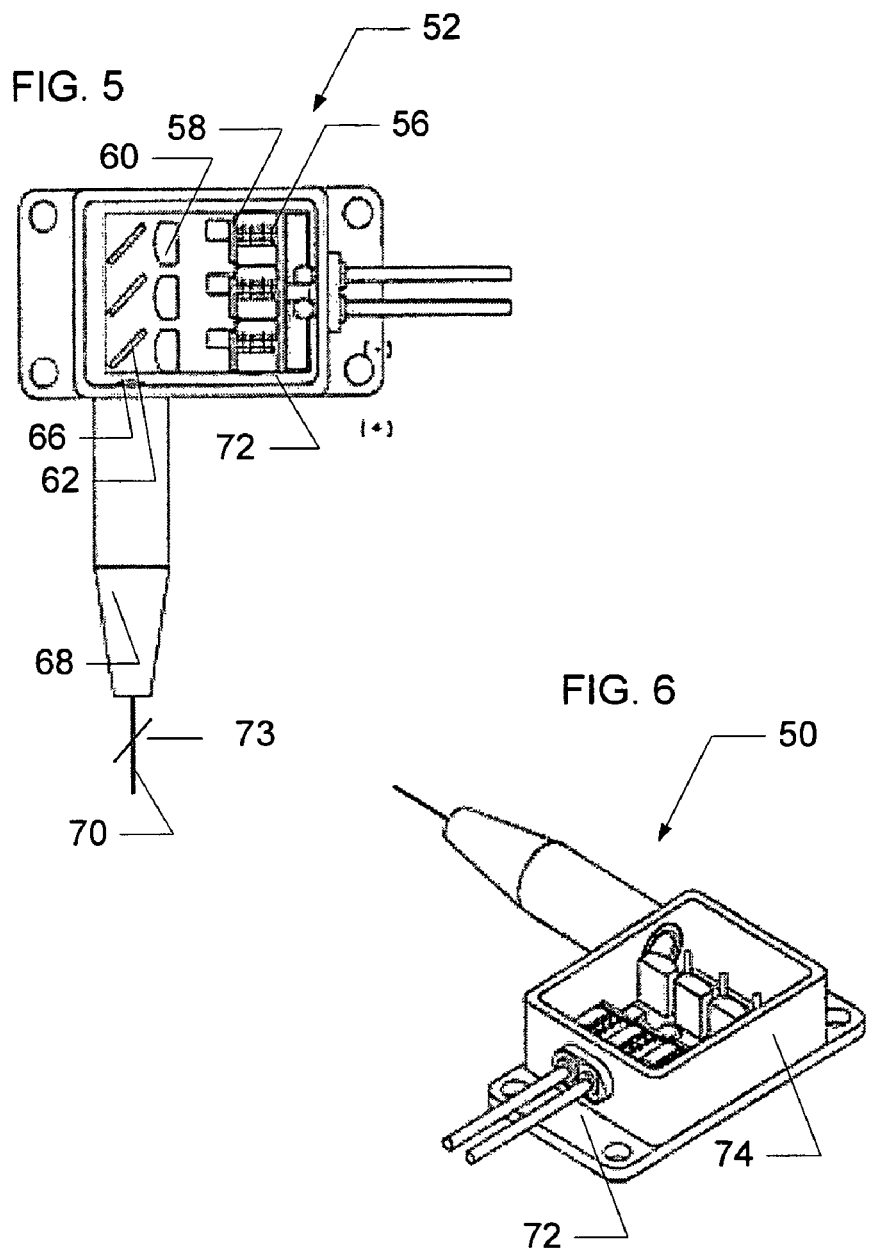

HIGH BRIGHTNESS LASER MODULE

BACKGROUND OF THE DISCLOSURE

1. Field of the Disclosure

The present invention relates to fiber lasers. In particular, the invention relates to a laser module configured to prevent backreflected radiation at the desired wavelength from propagating towards and damaging laser diodes.

2. Discussion of the Prior Art

Solid and all fiber lasers use a semiconductor laser as a light source for optical pumping which is attractive because of its efficiency, reliability, compactness and acceptable beam quality. Where modest power is needed, in the order of a watt or so with superior beam quality, such as a diffraction-limited spot, optical fiber lasers with solid state pump sources using a single diode or a single diode array pump source have been used. For higher power applications where several watts may be needed, use has been made of laser diode arrays as pump sources coupled to special fiber gain structures. For even higher power requirements, ten watts or more, high power laser diode bars, whose cavities emit a few modes, may be coupled to such specialty gain fibers. In other words, high-power laser light can be obtained by combining the outputs from the emitting cavities of respective multiple laser diodes. Regardless of the required power, a pump source should exhibit high brightness and low power losses to have the desired beam quality.

The pump light, coupled to a gain block, is able to produce monochromatic, coherent light through the stimulated emission of photons from atoms, molecules or ions of an active medium. The laser diodes are semiconductor devices containing a p-n junction which forms a diode,,and this junction functions as the active medium of the laser. The laser diodes are typically constructed from materials such as gallium arsenide and aluminum gallium arsenide alloys. The efficiency of such lasers in converting electrical power to output radiation is relatively high and, for example, can be in excess of 70 percent.

A typical laser assembly 10 is illustrated in FIG. 1 and includes a laser pump module 12 pumping a gain block 14. As readily realized by one of ordinary skills in the laser arts, light source module 12 may be easily associated with either the side- or end-pumping technique. The gain block 14 may include a single component, such as an oscillator provided with a gain medium which has a lasing cavity, or with multiple components, such as an oscillator and one or more amplifiers each pumped by respective pump modules 12. The pump module 12 may be configured with a single diode or an array of diodes 16, an output optical fiber 20 coupling the pump module to gain block 14 and coupling optics 18 guiding radiation from diodes 16 to fiber 20.

As a result of pumping, gain block 14 lases a light at the desired wavelength propagating along a waveguide. As the light propagates in a forward direction, the output light impinges upon a variety of internal and external obstacles or barriers. The internal barriers may include, for example, splices and interfaces between subsequent gain block components having different refractive indices. The external barriers may include the surface to be treated by the output light as, for example, in case of laser applications in welding or the cleaved or polished end of a fiber when the difference of refractive indices of air and glass causes light to reflect back. Up to several percents of the incident light, expressed in dB relative to incident power, tends to backreflect. The higher the incident power, the higher the backreflected power. The reflected light propagates backwards towards an upstream of waveguide terminating with a light source. A few dBs may detrimentally affect and even completely destroy laser diodes.

With the trend towards more and more powerful gain blocks, the protection of laser diodes from backreflection deserves a special attention. The backreflected light Lbr, at the lasing wavelength of gain block 14, is focused by optics 18 so that the only path it can further propagate along leads directly to laser diodes 16. This, in turn, may irreparably damage the diodes. As a consequence, the diodes need a protection.

As laser diodes become increasingly more powerful, so does the output light to be coupled into an active fiber of gain block 14 and so does the power of the output signal of block 14. At a certain level of power, the gain block/laser assembly is observed to have non-linear effects in the core of the active fiber. The detrimental effects of the non-linear effects are well known to one of ordinary skills and should be either minimized or completely avoided.

As readily realized by one of ordinary skills in the laser art, it is preferred that optically pumped gain blocks produce a substantially single transverse mode output. Diffraction limited, monomode output, optically pumped lasers, which use a simple, single pump source arrangement and are capable of producing monomode outputs around 100 mW, are useful for small-signal or low power applications. However, such lasers are not easily adapted to produce higher monomode powers, in the order of Watts and kilowatts.

While the above discussion is directed at the use of laser diode modules as a pump arrangement, it is apparent, that these modules may be used as a stand-alone unit for a variety applications. The backreflection phenomenon is always present regardless of any specific applications, A need, therefore, exists for a robust high brightness module configured with means for selectively reflecting backreflected lights at respective wavelength or wavelengths so as minimize damage therefrom to one or multiple laser diodes.

SUMMARY OF THE DISCLOSURE

These and other needs are satisfied by a laser module configured in accordance with the present disclosure. The laser module is configured with one or multiple laser diodes generating light at a diode laser wavelength and a combination of consecutive fast and slow coaxial lenses which are spaced along an upstream stretch of the light path and configured to focus the laser light beam. The focused light beam impinges upon a bending mirror having opposite surfaces which extend transversely to the optical axis of the laser diode so that the light beam is guided towards a gain block.

As the module generates an output light, the latter impinges upon an objective lens which couples it into the output fiber of the module delivering the output light to the object to be processed. For example, it may be an all fiber-configured or solid state gain block. In response, the gain block is operative to lase an output light signal at the desired wavelength which is different from and typically greater than the wavelength of the pump light.

Generated by the seed source of the gain block, a forward propagating light, which is emitted at a lasing wavelength, may either exit the system immediately downstream from the seed source, or propagate further along the laser assembly while being amplified in a single or multiple fiber amplifiers of the assembly. Typically, the fiber components of the laser assembly are fusion spliced. The splices, thus, form respective internal obstacles or barriers capable of backreflecting the forward propagating lased signal. In case of the all-fiber gain block, the input and output fibers of the respective neighboring fiber components may have different refractive indices and, thus, define respective interfaces backreflecting the forward propagating lased, light. The lased light exiting the gain block is also reflected from a variety of external obstacles, such as a fiber/air interface, surface or surfaces to be processed by the output light and others. The backreflected light at the lasing wavelength propagates backwards towards upstream fiber blocks, where it is typically amplified, and eventually impinges upon a pump module frequently irreversibly damaging it.

In accordance with one aspect of the disclosure, planar surfaces of respective optical components of the module, such as fast-axis and slow-axis collimating lenses, mirror, objective lens and the end of the output fiber, are selectively coated with a highly-reflecting transparent dielectric layer. The layer is configured to reflect and deflect the backreflected light at the lasing wavelength from a light path leading directly to the laser diode.

The configuration of the dielectric coating is not uniform for all optical components of the laser module and depends on a function and location of a given component along a light path. For example, the dielectric coating deposited on the bending mirror is substantially transparent to the backreflected light at the lasing wavelength due to the fact that the surfaces of the mirror extend transversely to optical axis of the laser diode.

On the other hand, the dielectric coating deposited on any of the lenses has high reflectivity at the lasing wavelength. This becomes readily apparent taken into account the fact that the planar surfaces of the respective lenses extend perpendicular to the optical axis of the laser diode. Likewise, the faucet of the output fiber has a dielectric coating similar to that one of the lenses.

BRIEF DESCRIPTION OF THE DRAWINGS

The above and other features and advantages of the disclosed structure will become more readily apparent from the following specific description explained in conjunction with the flowing drawings, in which:

FIG. 1 illustrates a diagrammatic view representing a rather typical configuration of the known prior art.

FIG. 2 illustrates a diagrammatic view of a laser assembly including a laser module which is configured in accordance with the present disclosure.

FIG. 3A is a graph illustrating the dependency of reflectivity of the mirror of the disclosed module provided with a dielectric coating in accordance with the disclosure on a wavelength of the gain block's output light.

FIG. 3B is a graph illustrating the dependency of reflectivity of the optical components of the disclosed module other than the mirror on a wavelength of the gain block's output light.

FIG. 4 is a diagrammatic view of the further embodiment of the disclosed system.

FIG. 5 is a top view of the disclosed module configured in accordance with the present disclosure and diagrammatically illustrated in FIG. 4.

FIG. 6 is an orthogonal view of the disclosed module of FIG. 5 shown without a removable top which covers the housing of the module.

SPECIFIC DESCRIPTION

Reference will now be made in detail to the disclosed system. Wherever possible, same or similar reference numerals are used in the drawings and the description to refer to the same or like parts or steps. The drawings are in simplified form but substantially corresponding to precise scale. For purposes of convenience and clarity only, the terms "connect," "couple," and similar terms with their inflectional morphemes do not necessarily denote direct and immediate connections, but also include connections through mediate elements or devices.

FIG. 2 illustrates a laser assembly 50 employing a high brightness module 52, which is configured in accordance with the disclosure, and a gain block 54. The module 52 is a radiation source emitting a pump light which is coupled, for example, to gain block 54 and capable of exciting an active medium of block 54 so as to stimulate light emission at the desired wavelength, which depends on the configuration of the gain medium but typically comprises a silica matrix doped with rare-earth elements such as Er, Yb, Tm and others. The light propagating in a forward direction at the desired wavelength along system 54 impinges upon a variety of internal structural irregularities or obstacles and reflects back into the system. Similarly, the light at the desired wavelength propagating through an interface which is defined by two mediums having respective different refractory indices also reflects back into the system. Finally, the light at the desired wavelength impinging upon the surface to be treated likewise tends to propagate back into gain block 54. The backreflected light is further guided in the reverse direction and eventually reaches module 52.

In accordance with one aspect of the disclosure including the protection of pump module 52 from the detrimental effect of the backreflected light, pump laser module 52 is provided with a means configured to selectively reflect the backreflected light at the desire/lasing wavelength. Shielding of the optical components, as disclosed hereinbelow, from the backreflected light at the desired wavelength preserves the life of pump module 52 and increases the efficiency of entire laser assembly 50.

The pump module 52 includes a source of radiation having a laser diode 56 outputting a pump light at a pump wavelength along a light path. A lens assembly coaxial with the optical axis of laser diode 56 and located downstream therefrom is operative to collimate the pump light and comprises of an upstream lens 58 and a downstream lens 60 collimating the fast and slow axes, respectively, of the pump light. The lens 58 and 60 both are configured with respective planar surfaces.

The collimated pump light further impinges upon a 90° bending mirror 62 that bends the light path at a 90 degree angle and couples the collimated pump light into the upstream end of a pump output fiber 70, which is partially housed in a collimator unit 68, by means of an objective lens 66. The pump output fiber guides the pump light towards gain block 54, as will be disclosed hereinbelow. The pumping of gain block 54 may include either an end configuration or a side configuration.

To prevent propagation of backreflected light Lbr at the desired wavelength from gain block 54 toward laser diode 56, at least one of the optical components of pump module 52 is configured with a means for selectively reflecting the backreflected Lbr. In accordance with one aspect of the invention, bending mirror 62 has at least one of its opposite planar surfaces deposited with a layer 64 which is made from dielectric material. The configuration of layer 64 is so selected that the backreflected light Lbr initially lased by gain block 54 at the wavelength, upon impinging the coated surface of mirror 62, substantially losslessly passes through and, thus, deviates from the light path of pump light Lin. As a consequence, laser diode 56 is not affected by the backreflected light at the desired wavelength. At the same time, layer 64 on mirror 62 and similar layers discussed hereinbelow coated on other components of module 52 allow for substantially lossless propagation of the pump light in opposite directions.

In accordance with a further modification of disclosed laser module 52, any of or all planar surfaces of respective lenses 58 and 60 can have a layer of dielectric material, such as a layer 59 on lens 58, which, like layer 64, prevents the propagation of backreflected light Lbr towards laser diode 56. However, in contrast to light-transmissive layer 64 deposited on mirror 52, layer 59 is highly reflective of backreflected light Lbr at the desired wavelength. The functional difference between layers 59 and 64 stems from the topography of module 52. For example, since the surfaces of mirror 62 constitute an angle differing from the right one with optical axis A-A' of laser diode 56, backreflected light has no other way as to pass through mirror 62. Otherwise, it would be reflected directly towards laser diode 56. The coated surfaces of the lens assembly 58 and 60 extend perpendicular to optical axis A-A' and thus prevent backreflected light Lbr from propagation to laser diode 56 by reflecting this light back towards gain block 54.

Still a further configuration of module 52 includes coating the upstream or downstream or both opposite faucets of output optical fiber 70 with a layer 71 configured similarly to the layer deposited on the lenses. Accordingly, layer 71 is operative to reflect backreflected light Lbr away from laser diode 56.

Thus, the surfaces as disclosed above, are coated either with a highly-transmissive coating, such as one on mirror 62, which is substantially transparent to the backreflected light at the desired/lasing wavelength, or, such as lenses 58, 60 and the faucet(s) of fiber 70, with a highly reflective layer. The material used for both types of coating is substantially the same and includes a plurality of alternating layers with high and low refraction indices with thickness equal to about ¼ of central wavelength divided by the refraction index of each layer and corrected to the reflection angle. To get approximately 99.9% of reflectivity, it is preferable to use approximately 30 pairs, each pair, thus, including two layers of materials with different indices. The coating material characterized by a relatively high refractive index may include, but not limited to, Ta2O5 (Tantalum Oxide), TiO2 (Titanium Oxide), HfO (Hafnium Oxide), Si3N4 (Silicon Nitride), ZnSe (Zinc Selenide), ZrO (Zirconium Oxide) and many others well known to one of ordinary skills in the optical arts. The coating made from low index materials may include, but is not limited to, SiO2 (Silicon Oxide) Al2O3 (Aluminum Oxide), MgF (Magnesium Fluoride), AlF (Aluminum Fluoride).

FIG. 3A illustrates a graph wherein transmission, expressed in %, is plotted against a wavelength. FIG. 3A represents the physical characteristics of dielectric layer 64 coated on mirror 62. Given only as an example, the desired wavelength—the lasing frequency of gain block 54—is about 1066 nm. The layer 64 is thus practically absolutely transparent to backreflected light Lbr at the desired wavelength. By comparison, layer 64 is highly reflective to pump light Lin at a pumping wavelength, which in this case, for example, is about 974 nm.

FIG. 3B, in turn, illustrates the physical characteristics of layer 59 (and other layers not shown but coated on the rest of optical components of module 52). In contrast to layer 64 of FIG. 3A, layer 59 is highly reflective of light at the desired wavelength 1066 nm, whereas pump light Lin at pumping wavelength passes through layer 59 practically without losses.

FIGS. 4, 5 and 6 illustrate a further embodiment of the disclosed laser assembly 50 of FIG. 2 configured to meet the need for higher powers and greater brightness imposed by several industries upon laser devices. This embodiment differs from the one illustrated in FIG. 2 by the number of laser diodes 56. However, multiple diodes are not arranged in a laser diode bar, which is so typical to the known prior devices. The laser diodes 56 are independently mounted to a support surface, as explained hereinbelow. Because of multiple diodes, such as three diodes, module 52 is capable of outputting up to about a 100 W output if a gain block operates in a CW regime, and much, much higher output for a pulsed laser.

Given only as an exemplary illustration, pump module 52 of FIGS. 4-6 includes three groups of optical components, each of which includes laser diodes 56, lenses 58 and 60, respectively, and mirror 62, configured identically to the structure of FIG. 2. However, as diagrammatically illustrated in FIG. 4, diodes 56 are mounted to a bottom 72 (FIG. 6) of a housing package 74 (FIG. 7) in a stepwise manner one above the other and, thus, independently from one another. The distance between planes in which respective diodes 56 terminate relative to bottom 72 is insignificant and may be as small as 300 microns. Accordingly, the rest of the optical components of each subsequent group is elevated above the respective components of the previous group at a uniform distance. Such a configuration allows objective lens 66, located along the light path of pump light Lin (FIG. 2), to focus the pump light from multiple sources and couple it to the upstream faucet of pump output fiber 70.

The pump module 52, regardless of the number of laser diodes 56, is enclosed in housing package 74 (FIG. 6). The pump output fiber 70 is mounted to collimator unit 68 (FIG. 5) in a manner well known to those skilled in the laser art.

The optical components of pump module 52 may be selectively covered with the dielectric layers disclosed above. For example, turning to FIGS. 2 and 5, only mirror 62 may have the dielectric layer. Alternatively, all of the optical components or any combination thereof may have such a dielectric layer.

The output light generated by gain block 54 is typically accompanied by Raman components which have a somewhat grater wavelength than the main generated light. In powerful laser assemblies 50 capable of outputting kWs, the Raman components gain a particularly destructive role while backreflecting towards the upstream of assembly 50. Typically reaching just a few dBs in a forward direction, the Raman components gradually gain greater and greater power while backreflecting through assembly 50 via one or more cascades of gain block 54. As a result, the backreflected Raman components may gain 80-100 dBs upon reaching module 52. The dielectric layer 59, 64 and 71 of FIG. 2 reliably protects laser diodes 56 of module 52 from the backreflected Raman components of light Lbr, since the wavelengths of the respective Lbr and its first Raman component are close to one another. Furthermore, some of the optical components of the laser module 52 can be provided with the layer configured as disclosed above and dealing only with the main backreflected light Lbr. Other components of the same group, however, may have a layer dealing with only wavelengths of Raman components of the main signal. The latter is realized by writing a slanted fiber grating 73 (FIG. 5) in the core of fiber 70, wherein the slanted fiber grating 70 is configured to couple out the Raman component from the core.

Although there has been illustrated and described in specific detail and structure of operations it is clearly understood that the same were for purposes of illustration and that changes and modifications may be made readily therein by those skilled in the art without departing of the spirit and the scope of this invention.

The invention claimed is:

1. A high brightness pump module outputting a pump light at a pump wavelength which is coupled into a fiber gain block generating an output light at a lasing wavelength different from the pump wavelength, the pump module comprising:
   a plurality of laser diodes individually coupled to a bottom of a housing in a stepwise manner and generating respective pump lights which propagate along respective parallel light paths;
   a plurality of groups of optical components coupled to the bottom of the housing, each group having first and second collimating components and a bending mirror, wherein the optical components of each group are aligned with the laser diode;
   an objective lens located in the housing downstream from the groups and configured to receive the pump lights from the bending mirrors and couple the received pump lights into an output optical fiber which guides the pump lights towards the gain block;
   a plurality of dielectric layers each having a first sub-layer of material with a high index of refraction and a second sub-layer of material with a low index of refraction, the dielectric layer being coated on an element selected from the group consisting of at least one of the optical components of the group, objective lens and output fiber and a combination thereof to prevent backreflected light at the lasing wavelength from propagating towards the laser diode.

2. The high brightness pump module of claim 1, wherein the reflector is a bending mirror operative to reflect the pump light at a 90° angle along the light path.

3. The high brightness pump module of claim 1, wherein
   the material with the high index of refraction is selected from the group consisting of Ta2O5 (Tantalum Oxide), TiO2 (Titanium Oxide), HfO (Hafnium Oxide), Si3N4 (Silicon Nitride), ZnSe (Zinc Selenide), ZrO (Zirconium Oxide) and a combination hereof, and
   the material with the low index of refraction is selected from the group consisting of SiO 2 (Silicon Oxide) Al2O3 (Aluminum Oxide), MgF (Magnesium Fluoride), AlF (Aluminum Fluoride) and a combination thereof.

4. The high brightness pump module of claim 1 further comprising a slanted fiber grating written in a core of the output optical fiber and configured to prevent propagation of a backreflected Raman component of the output light towards the laser diode.

* * * * *